United States Patent
Heath

(10) Patent No.: US 12,393,226 B2
(45) Date of Patent: Aug. 19, 2025

(54) DETACHABLE MODULAR CONSOLE FOR AIRCRAFT COCKPIT

(71) Applicants: COULSON AVIATION AUSTRALIA PTY LTD, Bankstown Aerodrome (AU); COULSON AIRCANE LTD., Port Alberni (CA)

(72) Inventor: Hamish Heath, Monavale (AU)

(73) Assignees: COULSON AVIATION AUSTRALIA PTY LTD, Bankstown Aerodrome (AU); COULSON AIRCANE LTD., Port Alberni (CA)

(*) Notice: Subject to any disclaimer, the term of this patent is extended or adjusted under 35 U.S.C. 154(b) by 203 days.

(21) Appl. No.: 18/266,474

(22) PCT Filed: Dec. 9, 2021

(86) PCT No.: PCT/CA2021/051765
§ 371 (c)(1),
(2) Date: Jun. 9, 2023

(87) PCT Pub. No.: WO2022/120483
PCT Pub. Date: Jun. 16, 2022

(65) Prior Publication Data
US 2024/0043136 A1 Feb. 8, 2024

Related U.S. Application Data

(60) Provisional application No. 63/124,045, filed on Dec. 10, 2020.

(51) Int. Cl.
G06F 1/16 (2006.01)
B64D 43/00 (2006.01)
H05K 5/02 (2006.01)

(52) U.S. Cl.
CPC .......... *G06F 1/1628* (2013.01); *B64D 43/00* (2013.01); *H05K 5/0234* (2013.01)

(58) Field of Classification Search
CPC ...... G06F 1/1628; B64D 43/00; H05K 5/0234
USPC ........................................................ 361/600
See application file for complete search history.

(56) References Cited

U.S. PATENT DOCUMENTS

| | | | |
|---|---|---|---|
| 11,483,942 B2 * | 10/2022 | Lawhon | H05K 7/1434 |
| 2010/0140397 A1 * | 6/2010 | Van Wassenhove | B64D 11/0689 244/118.5 |
| 2011/0270469 A1 * | 11/2011 | Bopp | G06F 1/163 361/679.01 |

(Continued)

FOREIGN PATENT DOCUMENTS

WO 2010069923 A1 6/2010

*Primary Examiner* — Zhengfu J Feng
(74) *Attorney, Agent, or Firm* — Flaster Greenberg P.C.

(57) ABSTRACT

Disclosed herein is a detachable modular console for an aircraft cockpit. The detachable modular console comprises a housing configured to receive one or more modular electronic components, a plurality of hardpoint fasteners for detachably fastening the housing to hardpoints in a floor of the aircraft cockpit, a leveling foot to engage the floor to stabilize the console and a display screen supported by the housing. The detachable modular console can house various modular electronic components. A rail enables rapid replacement of other electronic components. The hardpoints enable the console to be secured to the floor of the cockpit.

11 Claims, 6 Drawing Sheets

(56) References Cited

U.S. PATENT DOCUMENTS

| | | | |
|---|---|---|---|
| 2012/0075120 A1* | 3/2012 | Barbieri | B64D 43/00 340/946 |
| 2014/0230641 A1* | 8/2014 | Isola | F41A 23/24 89/37.17 |
| 2014/0291444 A1* | 10/2014 | Baudry | B64D 11/0689 244/118.5 |
| 2018/0009532 A1* | 1/2018 | Cazals | B64D 11/0602 |
| 2021/0039805 A1* | 2/2021 | Tentinger | H05K 7/1412 |
| 2021/0235593 A1* | 7/2021 | Bousquet | H05K 7/1412 |
| 2022/0017204 A1* | 1/2022 | Helou, Jr. | B64C 1/22 |

* cited by examiner

DETACHABLE MODULAR CONSOLE FOR AIRCRAFT COCKPIT

CROSS REFERENCE TO RELATED APPLICATIONS

This application is the 371 National Stage of International Application No. PCT/CA2021/051765, filed Dec. 9, 2021, which claims priority to U.S. Provisional Patent Application No. 63/124,045, filed Dec. 10, 2020, the disclosures of each of which are incorporated herein by reference in their entireties.

TECHNICAL FIELD

The present invention relates generally to aircraft cockpits and, more particularly, to consoles for aircraft cockpits.

BACKGROUND

For multi-role aircraft it is sometimes desirable to change the electronic equipment in the aircraft cockpit to provide the crew with the electronic equipment they require for a particular mission. To install or remove electronic components from an aircraft cockpit may be time-consuming and require specialized technicians to ensure that the components are properly and safely installed.

There is accordingly a need in the aircraft industry for a new or improved console that would enable rapid and efficient changing of onboard electronic components.

SUMMARY

The following presents a simplified summary of some aspects or embodiments of the invention in order to provide a basic understanding of the invention. This summary is not an extensive overview of the invention. It is not intended to identify key or critical elements of the invention or to delineate the scope of the invention. Its sole purpose is to present some embodiments of the invention in a simplified form as a prelude to the more detailed description that is presented later.

The present specification discloses a detachable modular console for an aircraft cockpit. The detachable modular console comprises a housing configured to receive one or more modular electronic components, a plurality of hardpoint fasteners for detachably fastening the housing to hardpoints in a floor of the aircraft cockpit, a leveling foot to engage the floor to stabilize the console and a display screen supported by the housing. The detachable modular console can house various modular electronic components. A rail enables rapid replacement of other electronic components. The hardpoints enable the console to be secured to the floor of the cockpit.

BRIEF DESCRIPTION OF THE DRAWINGS

These and other features of the disclosure will become more apparent from the description in which reference is made to the following appended drawings.

DETAILED DESCRIPTION OF EMBODIMENTS

Figure 1:
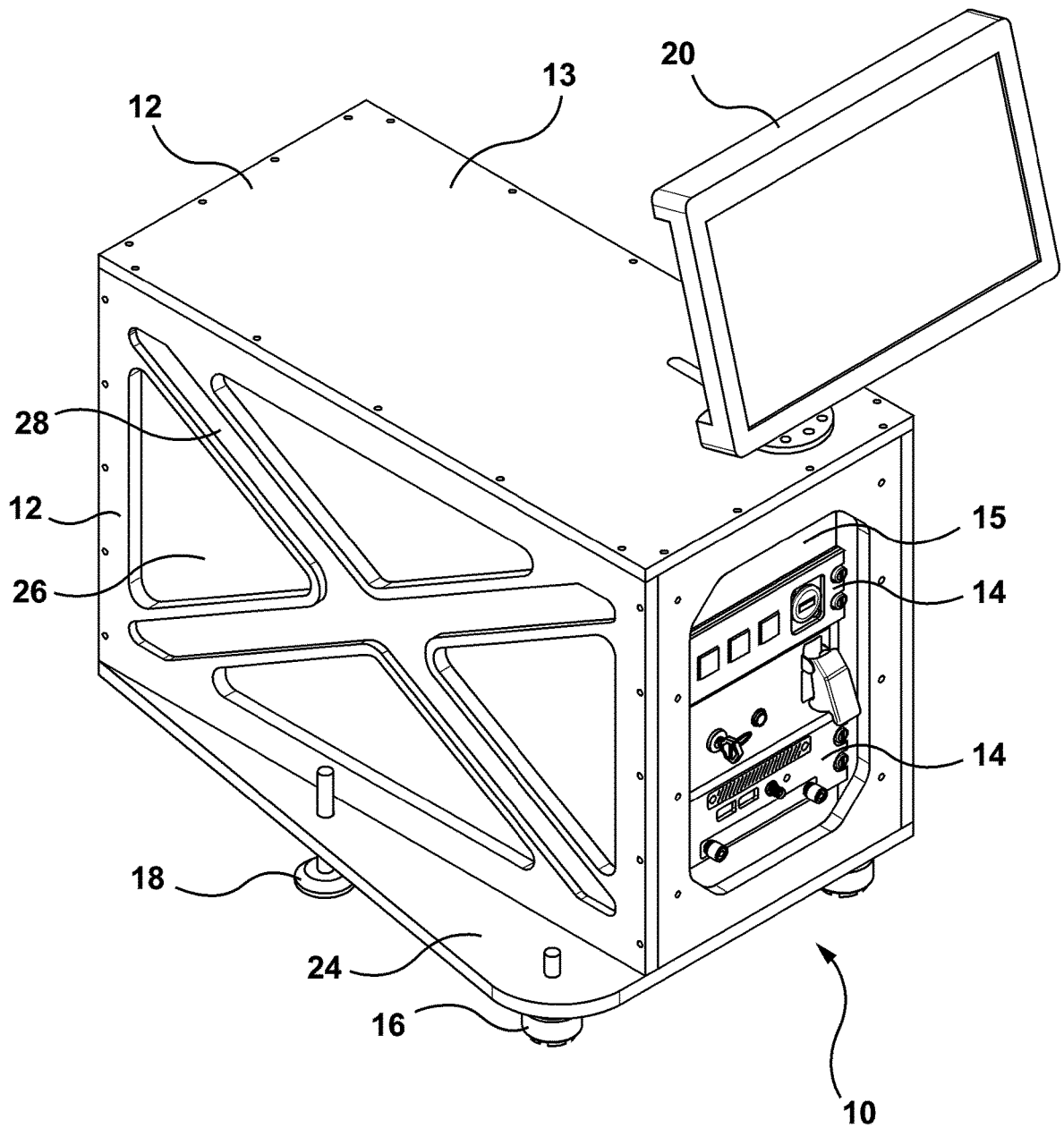
FIG. 1 is an isometric view of a detachable modular console for an aircraft cockpit in accordance with an embodiment of the present invention.

The following detailed description contains, for the purposes of explanation, numerous specific embodiments, implementations, examples and details in order to provide a thorough understanding of the invention. It is apparent, however, that the embodiments may be practiced without these specific details or with an equivalent arrangement. In other instances, some well-known structures and devices are shown in block diagram form in order to avoid unnecessarily obscuring the embodiments of the invention. The description should in no way be limited to the illustrative implementations, drawings, and techniques illustrated below, including the exemplary designs and implementations illustrated and described herein, but may be modified within the scope of the appended claims along with their full scope of equivalents.

In the embodiment of the present invention illustrated in FIGS. 1-7, a detachable modular console is designed to be detachably mounted to the floor of an aircraft cockpit, such as for example to the floor of a helicopter cockpit. Although the console has been designed initially for use in a helicopter, the console may also be used in a fixed-wing aircraft. The console which is generally denoted by reference numeral 10 includes a housing 12 configured to receive one or more modular electronic components 14. The housing has a top surface 13, a front face 15, and a rear face 17 that is spaced-apart and generally parallel to the front face. The one or more modular electronic components 14 are accessible through the front face, i.e. to enable the pilot or co-pilot to select buttons, toggles, switches or other controls of the one or more modular electric components.

The housing also has a pair of side faces 26 that are spaced-apart and parallel to each other. In this embodiment, the housing 12 has a height greater than its width. In this embodiment, the housing has a depth (length) greater than the height.

The detachable modular console 10 includes a plurality of hardpoint fasteners 16 for detachably fastening the housing to hardpoints in a floor of the aircraft cockpit, i.e. hardpoints that are secured to the floor of the aircraft cockpit. There are three hardpoint fasteners in the illustrated embodiment although it will be appreciated that the number of hardpoint fasteners may be varied. In this specific example implementation, the hardpoint fasteners are threaded studs. Preferably, the hardpoint fasteners are three 12-jaw threaded studs. Any other suitable fastener may be used depending on the hardpoints available in the floor of the aircraft cockpit.

The detachable modular console 10 as illustrated by way of example in FIGS. 1-7 includes a leveling foot 18 extending from a bottom of the housing to engage the floor to stabilize the console and to minimize vibrations in the console. The leveling foot 18 has a threaded rod that is threadedly attached to a correspondingly threaded socket or bore in a flange-like extension 24 of the housing 12. The leveling foot 18 is adjusted by rotating the threaded rod relative to the bore. The leveling foot 18 may be made of, or may include, an elastomeric or other resilient material to absorb vibrations. The flange-like extension 24 in this particular embodiment extends laterally from a bottom face of the housing while also extending forwardly from a corner of the bottom face and the rear face. As shown in the figures, in this embodiment, this flange-like extension 24 diverges outwardly toward the front face 15 to form a laterally protruding angled plate having a rounded forward end. This flange-like extension 24 supports both the leveling foot 18 and one of the two forward hardpoint fasteners 16 as shown by way of example in the figures. The flange-like extension 24 extends laterally from a bottom of the left side of the housing 12. This flange-like extension 24 provides a means to offset or counterbalance the asymmetrically mounted display screen 20.

The detachable modular console 10 includes a display screen 20, e.g. a touch screen, supported by the housing 12. A movable support arm 22 is connected to the housing 12 and to the display screen 20 to support the display screen 20 above the housing 12. The display screen 20 is designed to be visible by the pilot or co-pilot when seated in the aircraft cockpit. In the illustrated embodiment, the movable support arm 22 extends from a top surface 13 of the housing 12 from an attachment point that is near the front face 15 of the housing 12. In the specific embodiment, this attachment point is closer to the front face 15 of the housing 12 than to a vertical midplane of the housing 12 (where the vertical midplane bisects the housing 12 lengthwise through its depth, i.e. the midplane divides the housing lengthwise in half from front to rear). In the illustrated embodiment, the attachment point is asymmetrically disposed on the housing 12. For example, as shown in this embodiment, the attachment point is on the right side of the top surface 13 of the housing 12. The display screen 20 in this embodiment extends forward such that a forward-most portion of the display screen protrudes beyond the plane defined by the front face of the housing. In this illustrated embodiment, the right-most portion of the display screen 20 protrudes beyond a right-side face of the housing.

In the illustrated embodiment, the top surface 13 of the housing 12 is a solid top surface. The front face 15 is a partially open front face to enable access to the one or more electronic components that are inserted into the housing 12. The side faces 26 are partially open sides having generally X-shaped cross-braces 28 for structural support while permitting heat to dissipate from the one or more electronic components.

The one or more electronic components 14 may comprise a mission computer providing an augmented reality mapping system, a video encoding device, and/or a multi-cellular downlink device. Other electronic components may be housed in the console. The housing comprises a Dzus rail to interchange the one or more modular electronic components.

Figure 2:
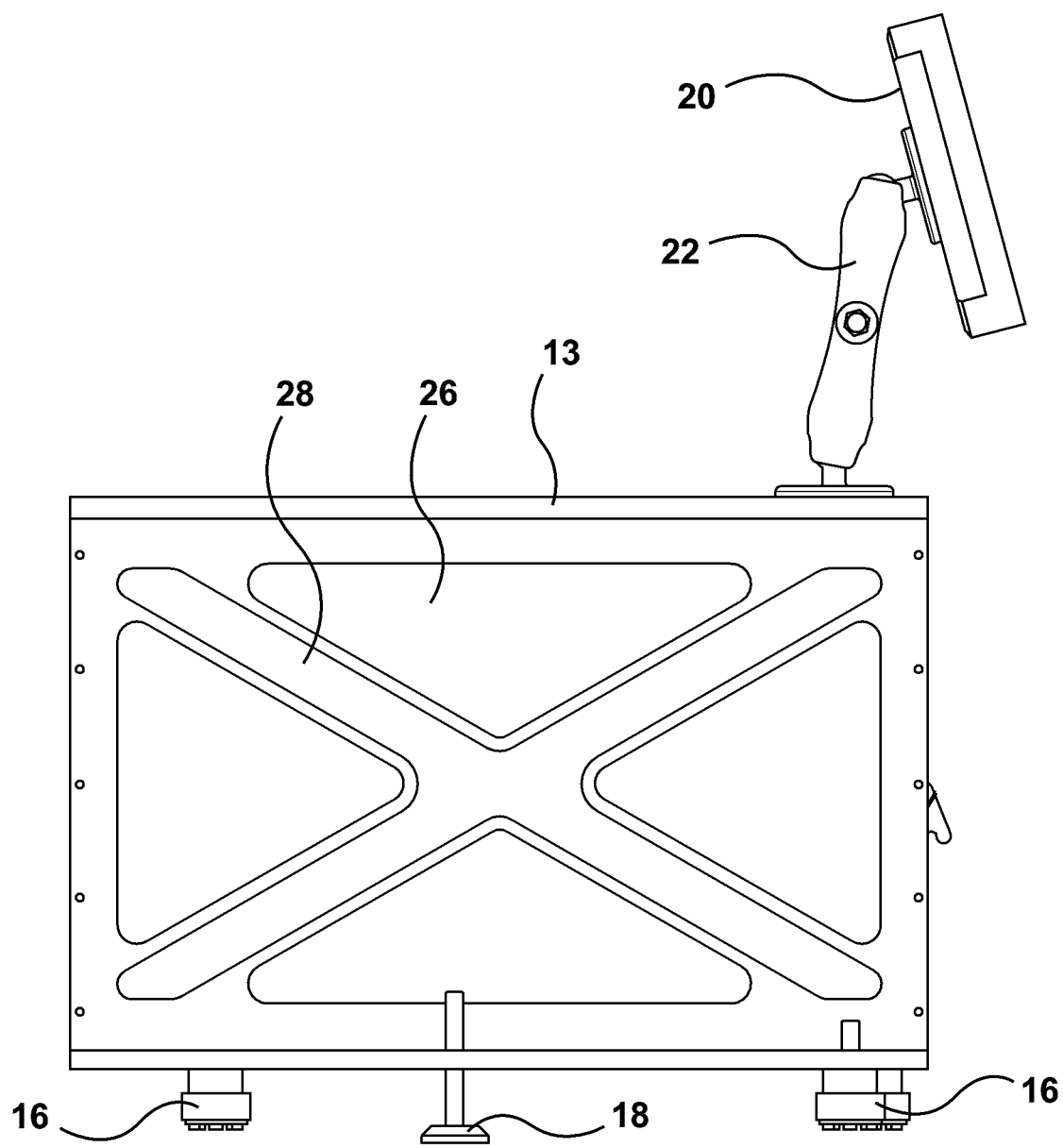
FIG. 2 is a side view of the console.
Figure 3:
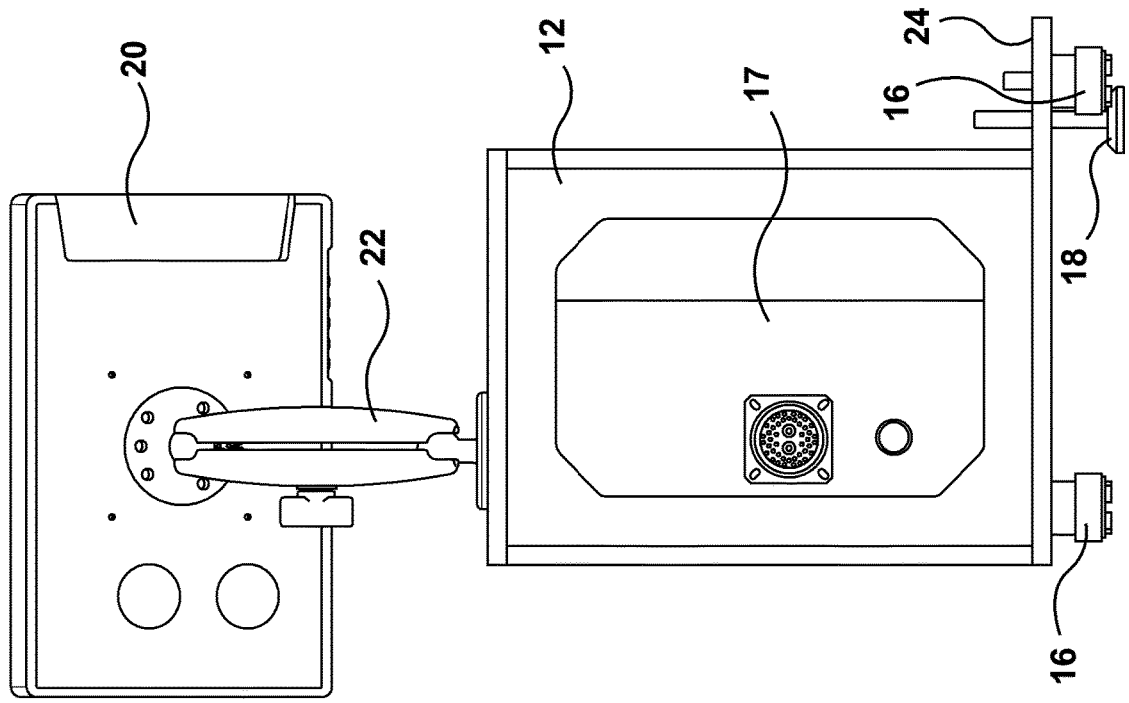
FIG. 3 is a front view of the console.
Figure 4:
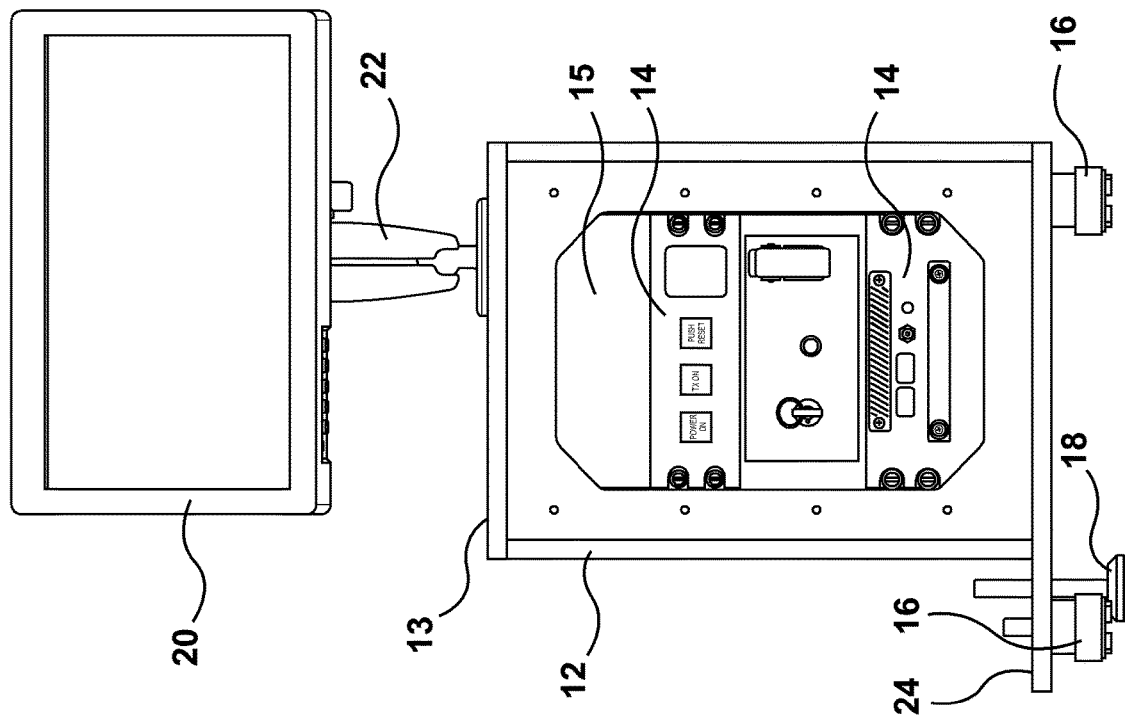
FIG. 4 is a rear view of the console.
Figure 5:
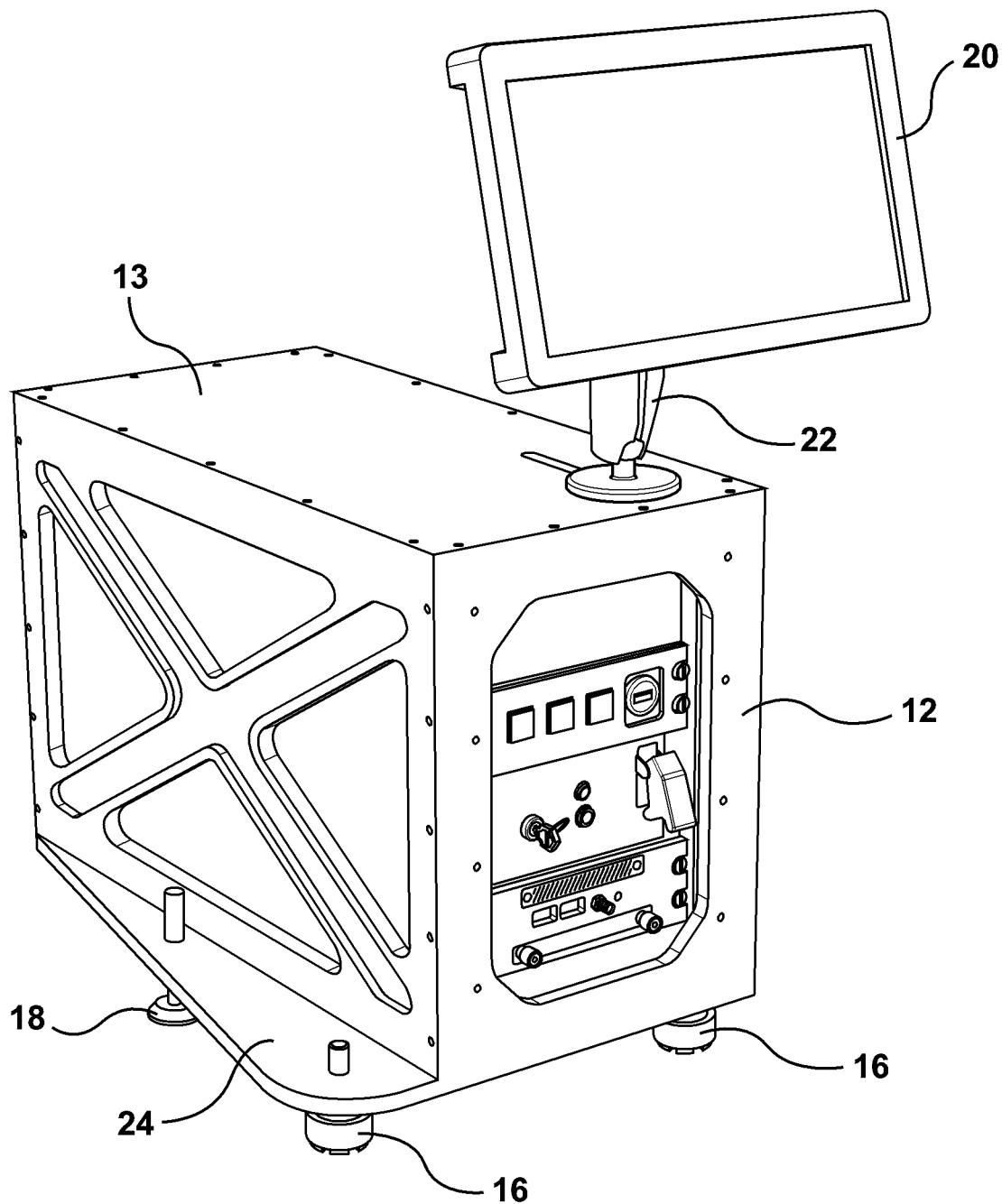
FIG. 5 is a front isometric view of the console.
Figure 6:
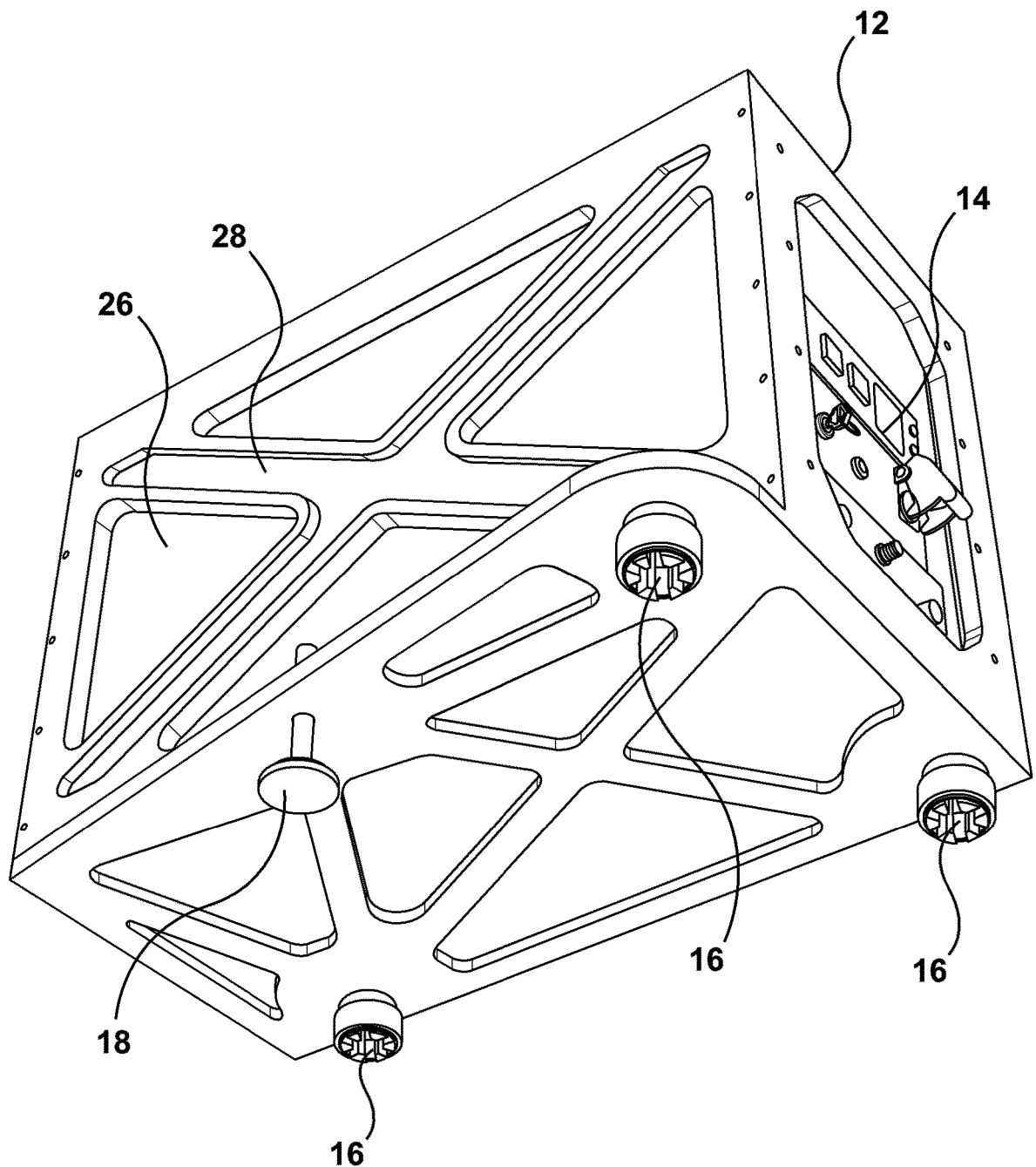
FIG. 6 is a bottom isometric view of the console.
Figure 7:
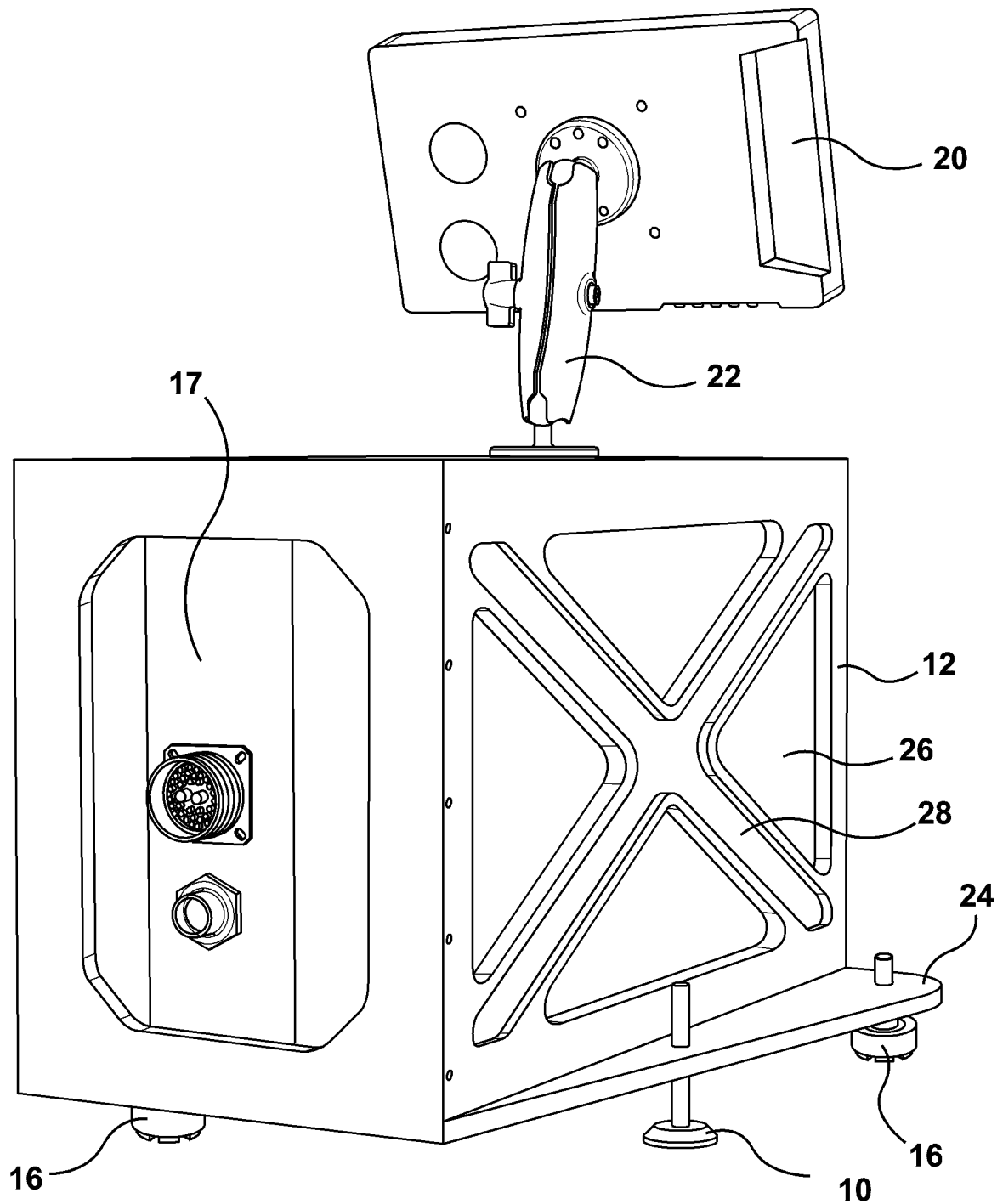
FIG. 7 is a rear isometric view of the console.

The console 10 illustrated has a housing 12 and hardpoint fasteners that are specifically designed in this particular example to mount into the existing hardpoints of a Bell 412 helicopter. Using existing hardpoints avoids the need to make any modifications to the airframe for installation of the console. In this specific example, the three fasteners are 12-jaw threaded studs (PN 33115), also known as 12-jaw stud fittings with threaded studs, to attach the console to three mounting positions (hardpoints) within the airframe. A tensioned levelling foot is then screwed down to the floor to minimize or attenuate vibrations. The tensioned levelling foot also enables rapid removal and installation of the console. As illustrated in FIG. 2, when viewed from the side, the leveling foot 18 is disposed between the two front hardpoint fasteners 16 and the rearward hardpoint fastener 16 along a depth of the housing from the front to the rear. Specifically, in this embodiment, the leveling foot 18 is disposed between the two front hardpoint fasteners 16 and the rearward hardpoint fastener 16 at a point between the front and rear hardpoint fasteners that is between halfway to three-quarters backward from the two front hardpoint fasteners in a depth-wise direction toward the rear hardpoint fastener.

It will be appreciated that in other helicopters or other fixed-wing aircraft, the hardpoint fasteners may be spaced differently to fit the geometry of the hardpoints in any given aircraft cockpit. The illustrated console shown in the drawings is an integrated mission system that includes a touch screen interface for the operator, a mission computer, e.g. the Churchill navigation ARS-700 mission computer, video encoding and multi-cellular downlink. The mission console in this example implementation also interfaces with the Star Safire 380HDC gyrostabilized gimbal. The specific type of helicopter and the specific electronic components mentioned above are not meant to limit the invention but merely to illustrate one very specific example implementation.

The operator (e.g. pilot or co-pilot) interfaces with the electronic components in the console via the touch screen display of the console and push button switches or other such human-machine interface elements that control the electronic component and systems.

The console has been designed to be highly modular in order to allow for rapid changes of internal componentry. A Dzus rail has been utilised on the front of the console to enable the use of modular components. All the power and communication mount to configurable plates in the interior of the housing. The console has a common interface connector that allows for sensors to be easily changed without a complete redesign of the interface.

It is to be understood that the singular forms "a", "an" and "the" include plural referents unless the context clearly dictates otherwise. Thus, for example, reference to "a device" includes reference to one or more of such devices, i.e. that there is at least one device. The terms "comprising", "having", "including", "entailing" and "containing", or verb tense variants thereof, are to be construed as open-ended terms (i.e., meaning "including, but not limited to,") unless otherwise noted. All methods described herein can be performed in any suitable order unless otherwise indicated herein or otherwise clearly contradicted by context. The use of examples or exemplary language (e.g. "such as") is intended merely to better illustrate or describe embodiments of the invention and is not intended to limit the scope of the invention unless otherwise claimed.

While several embodiments have been provided in the present disclosure, it should be understood that the disclosed systems and methods might be embodied in many other specific forms without departing from the scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the inventive concept(s) disclosed herein.

What is claimed is:

1. A detachable modular console for an aircraft cockpit of an aircraft, the detachable modular console comprising:
- a housing configured to receive one or more modular electronic components, the housing having a front face through which the one or more modular electronic components are accessible;
- a plurality of hardpoint fasteners for detachably fastening the housing to hardpoints secured to a floor of the aircraft cockpit;
- a leveling foot extending from a bottom of the housing, the leveling foot being configured to engage the floor to stabilize the detachable modular console; and
- a display screen supported by the housing, wherein the display screen is visible to a pilot or co-pilot of the aircraft when sitting in the aircraft cockpit of the aircraft.

2. The detachable modular console of claim 1, wherein the one or more electronic components comprises a mission computer providing an augmented reality mapping system.

3. The detachable modular console of claim 1, wherein the one or more electronic components comprises a video encoding device.

4. The detachable modular console of claim 1, wherein the one or more electronic components comprises multi-cellular downlink device.

5. The detachable modular console of claim 1, wherein the housing comprises a Dzus rail to interchange the one or more modular electronic components.

6. The detachable modular console of claim 1, comprising a movable support arm connected to the housing and to the display screen to support the display screen above the housing.

7. The detachable modular console of claim 1, wherein the hardpoint fasteners are three 12-jaw threaded studs.

8. The detachable modular console of claim 1, comprising a flange-like extension that extends laterally from a bottom of the housing.

9. The detachable modular console of claim 1, comprising a flange-like extension that extends laterally from a bottom of a left side of the housing, and wherein the display screen is mounted to an attachment point on a right side of the housing.

10. The detachable modular console of claim 9, wherein the flange-like extension receives the leveling foot.

11. The detachable modular console of claim 10, wherein the flange-like extension diverges outwardly toward the front face of the housing to form a laterally protruding angled plate having a rounded forward end.

* * * * *